(12) United States Patent
Feldtkeller

(10) Patent No.: US 8,203,335 B2
(45) Date of Patent: Jun. 19, 2012

(54) SYSTEM AND METHOD FOR AN INDUCTIVE PROXIMITY SWITCH ON A COMMON SUBSTRATE

(75) Inventor: Martin Feldtkeller, Munich (DE)

(73) Assignee: Infineon Technologies Austria AG, Villach (AT)

( * ) Notice: Subject to any disclaimer, the term of this patent is extended or adjusted under 35 U.S.C. 154(b) by 1056 days.

(21) Appl. No.: 12/058,521

(22) Filed: Mar. 28, 2008

(65) Prior Publication Data

US 2009/0243601 A1    Oct. 1, 2009

(51) Int. Cl.
*G01B 7/14* (2006.01)
*H03K 17/945* (2006.01)

(52) U.S. Cl. .................... 324/207.26; 307/130

(58) Field of Classification Search ............. 324/207.26; 307/130
See application file for complete search history.

(56) References Cited

U.S. PATENT DOCUMENTS

| | | | | |
|---|---|---|---|---|
| 3,684,961 A * | 8/1972 | Muir | ........................ | 324/207.18 |
| 4,425,511 A * | 1/1984 | Brosh | ............................ | 307/106 |
| 4,673,827 A * | 6/1987 | Sommer | ....................... | 307/116 |
| 4,779,048 A * | 10/1988 | Aichele | ..................... | 324/207.18 |
| 6,043,644 A * | 3/2000 | de Coulon et al. | ........ | 324/207.18 |
| 6,803,757 B2 * | 10/2004 | Slates | ....................... | 324/207.17 |
| 6,949,925 B2 * | 9/2005 | Johnson et al. | .......... | 324/207.26 |
| 6,984,975 B2 * | 1/2006 | Aruga et al. | ............... | 324/207.17 |
| 7,106,052 B2 * | 9/2006 | Ehls et al. | ................ | 324/207.12 |
| 2002/0039023 A1 * | 4/2002 | Jagiella et al. | ........... | 324/207.26 |
| 2004/0130318 A1 * | 7/2004 | Saltsov et al. | ............ | 324/207.17 |
| 2007/0001666 A1 * | 1/2007 | Lee | ........................... | 324/207.15 |
| 2009/0309579 A1 * | 12/2009 | Cochran | .................. | 324/207.16 |
| 2010/0141245 A1 * | 6/2010 | Lee | ........................... | 324/207.24 |

\* cited by examiner

*Primary Examiner* — Jay Patidar
(74) *Attorney, Agent, or Firm* — Slater & Matsil, L.L.P.

(57) ABSTRACT

An inductive proximity switch device has inductive elements including at least one transmitter coil and at least one receiver coil disposed on a common substrate. The inductive elements are arranged in one or more metalizing layers on the common substrate, and an evaluation circuit is coupled to at least one of the plurality of the inductive elements.

32 Claims, 7 Drawing Sheets

SYSTEM AND METHOD FOR AN INDUCTIVE PROXIMITY SWITCH ON A COMMON SUBSTRATE

BACKGROUND

Inductive proximity switches are widely used in industrial automation technology. In contrast to switching contacts and capacitive proximity switches, inductive proximity switches are insensitive to pollution and relatively inured to electromagnetic impacts. Inductive proximity switches are subject to a plurality of implementations. For instance, small sized proximity switches can be cast in plastic screws to place them into threads provided in automation facilities for sensing metal bodies in the proximity.

In general, inductive proximity switches comprise a coil that is usually accommodated in half a ferrite basin core, and an oscillator circuit that is tuned such that it oscillates with a high-quality or high-performance coil, but does not oscillate with a coil of less quality or performance. The oscillation amplitude is rectified, and a digital signal derived therefrom is issued to an output signal. If a large metal object or body is present in the stray field of the coil, the otherwise high quality of the coil will be reduced to a small value. By means of an evaluation circuit evaluating the output signal it can be recognized whether a metal object is in the vicinity of the proximity switch or not.

Since monolithically integrated coils may have a low quality and a smaller stray field due to their dimensions, the technology of known proximity switches with a discrete coil cannot readily be transferred to monolithically integrated proximity switches. Oscillating circuits of monolithically integrated coils and capacitors have, with a reasonable chip face, resonance frequencies of several GHz. The depth of penetration of the stray field in an adjacent metal object is so small with this frequency that an inductance change may be achieved, but hardly a change in quality as described above. Thus, the inductance change may not be reliably detected by amplitude detection of an oscillator vibration.

SUMMARY OF THE INVENTION

A proximity switch device, a system and/or method are provided, e.g., as shown in and/or described in connection with at least one of the figures, and/or as set forth more completely in the claims.

Various advantages, aspects and novel features of the present application will be more fully understood from the following description and drawings.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended benefits of the present invention will be readily appreciated as they become better understood by reference to the following detailed description. The elements of the drawings are not necessarily to scale relative to each other. Like reference numerals designate corresponding or similar parts.

DETAILED DESCRIPTION OF ILLUSTRATIVE EMBODIMENTS

Figure 1:
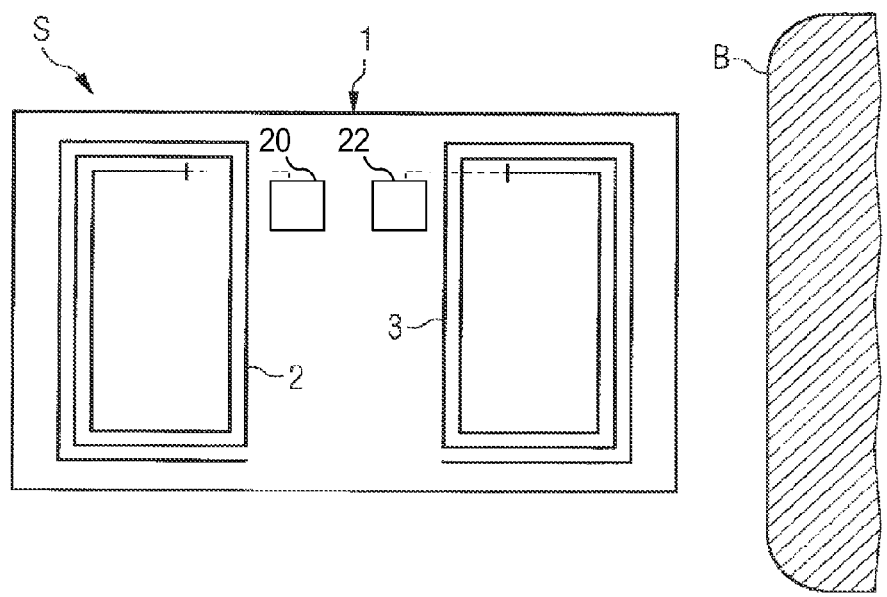
FIG. 1 shows an embodiment of an inductive proximity switch with integrated inductive elements or coils according to the present invention in a schematic plan view.

According to an aspect of the present invention an inductive proximity switch is provided, wherein a number of inductive elements are provided on the same substrate or chip of the proximity switch. According to an embodiment of the present invention, the inductive elements can be situated in one or more metalizing layers on the same substrate or chip as an evaluation circuit for evaluating output signals of the inductive elements. The inductive elements of the proximity switch may be implemented, for instance, as a coil or an antenna. The inductive elements may comprise a plurality of conductor paths or windings arranged on the chip or substrate of the proximity switch, respectively.

Another embodiment of the proximity switch according to the present invention comprises at least two inductive elements or coils spaced apart from each other. Thus, inductive elements or coils may be oriented with respect to the metal object to be detected such that one of the inductive elements or coils is positioned closer to the metal object than the other coil. The layout of the two inductive elements or coils may be such that they comprise the same inductance with an undisturbed electromagnetic stray field. If a metal object is present in the vicinity of the proximity switch, the inductance of the coil closer to the metal object may change in a higher extent than the inductance of the coil that is more remote to the metal object.

According to another aspect of the present invention a difference in inductance of the inductive elements or coils in the proximity switch can be detected wherein both coils are connected with equal capacitors to resonance circuits and the phasing of the oscillations is compared at the same frequency.

Alternatively, the difference in inductance of the inductive elements or coils in the proximity switch can be detected wherein both inductive elements or coils are coupled with a capacitor and with active devices, respectively, to form LC oscillator circuits comprising an inductive element (L) and a capacitive element (C). The LC oscillators circuits can be alternately switched on and off, and the frequency modulation of a sum signal from the two oscillator vibrations is evaluated. In this evaluation the frequency modulation can be detected with a PLL circuit.

Still alternatively, the difference in inductance of the inductive elements or coils in the proximity switch can be detected wherein both inductance values of the inductive elements or coils in the proximity switch are compared with each other in a bridge circuit. The operating frequency may be lower compared to the above two alternatives, since the quality of the coil is not critical for the bridge circuit. For instance, inductive elements or coils with magnetic diameters of about 1 mm may comprise operating frequencies in the range of about 100 MHz.

Another embodiment of the proximity switch according to the present invention comprises at least three inductive elements or coils on a chip or substrate of the proximity switch. The inductive elements or coils may be monolithically integrated on a common chip or substrate. One of these inductive elements or coils may act as a transmitter coil and generates a magnetic stray field that reaches a metal object that may be present in the vicinity. Two more inductive elements or coils may act as receiver coils and may be arranged such that, with an undisturbed stray field, the voltages induced in the receiver coils are substantially equal. Both the transmitter coil and the receiver coils may comprise a plurality of conductor paths or windings arranged on the chip or substrate of the proximity switch.

If a metal object or body comes into the stray field such that the magnetic field flowing through one of the two receiver coils changes more strongly than the magnetic field flowing through the other receiver coil, the approximation of the metal object may be detected from a difference of the two induced voltages. The evaluation of the voltages induced in the receiver coils may be performed by means of a differential amplifier. Alternatively, the receiver coils may also be connected complementary in series with each other, so that their induced voltages will cancel each other with an undisturbed stray field.

The receiver coils may be arranged inside or outside of the dimensions of the transmitter coil. Furthermore, the receiver coils may be arranged in a layer that is parallel to the layer of the transmitter coil such that a part of their cross-section is positioned inside of the dimensions of the transmitter coil and another part of their cross-section is positioned outside of the dimensions of the transmitter coil. Thus, the voltage induced in the receiver coils with an undisturbed stray field and hence the common mode control range of a connected differential amplifier can be reduced.

According to another embodiment of the present invention more than two receiver coils may be available and connected such that their induced voltages may substantially cancel each other in case of an undisturbed stray field with no metal object or body positioned in the vicinity of the proximity switch, and may not cancel each other in case of a disturbed stray field due to a metal object or body positioned in the vicinity of the proximity switch. The transmitter coil and the receiver coils may be arranged in a planar manner integrated on one substrate or chip of the proximity switch.

According to another embodiment of the present invention only one transmitter coil and one receiver coil are provided in the proximity switch, wherein the receiver coil is positioned in a layer parallel to the layer of the transmitter coil. Furthermore, the receiver coil may be arranged in a staggered manner with respect to the transmitter coil such that, with an undisturbed stray field, the magnetic flux passing through the receiver coil outside and inside the transmitter coil may be compensated.

In another embodiment of the proximity switch according to the present invention the transmitter coil may be arranged with different distances of the windings such that their magnetic stray field is directed asymmetrically in the direction of a metal object to be expected in the vicinity. The arrangement of the coils in the proximity switch relative to each other may be, due to suitable methods of semiconductor production, subject to small fluctuations only. Once an appropriate layout of the inductive elements or coils has been established, no further alignment of the inductive elements or coils is necessary.

Regarding the choice of the operating frequency, on the one hand, the accuracy of the evaluation circuit is relevant and, on the other hand, that sufficient voltage is induced in the receiver coils. With a magnetic cross-section of a few square millimeters, the frequency can be in the range of about 10 MHz to about 100 MHz. Alternatively, the operating frequency may be chosen so low that the magnetic stray field of the inductive elements or coils of the proximity switch penetrates into a metal body positioned in the vicinity.

The current flowing through a transmitter coil may be switched on and off in a pulse-shaped or in a sinusoidal manner, wherein the pulses and the pulse pauses preferably last until the magnetic stray field has reached a quasi stationary state or has decayed almost completely, respectively. Due to the electric conductivity of a metal object positioned in the vicinity of the proximity switch, the magnetic field inside the metal object can be built up and broken down more slowly than outside thereof. Alternatively, the current flowing through a transmitter coil may be sinusoidal.

The transmitter coil may be controlled by a control pulse in a manner such that the current flowing through it can commutate in a short time period. At the moment of switching off the current flowing through the transmitter coil, due to the magnetic field that collapses instantly outside the metal object, a high voltage pulse or commutation pulse is induced in the transmitter coil which is directed opposite to the control pulse.

In case no metal object is present in the vicinity of the proximity switch, the voltage in the transmitter coil without current flow may decay to zero in a short time period after this commutation pulse. If, however, a metal object is in the vicinity, the magnetic field is capable of decaying more slowly in the interior of the metal object, so that a magnetic stray field may also decay slowly in the vicinity thereof. In consequence, a part of the decaying magnetic stray field may induce a voltage or a current flowing through the transmitter coil and can be detected as induced voltage.

In an inductive proximity switch according to the last mentioned embodiment of the present invention, only one coil is necessary which may be coupled to a switchable current source and an amplifier. For circuit-technological reasons, separate transmitter and receiver coils may be provided in the proximity switch. The coils in the proximity switch may be arranged in a manner such that a magnetic stray field of the transmitter coil flowing through the metal object reaches the receiver coil during the subsequent relaxation of the magnetic stray field.

Due to the induced voltage characteristic during relaxation of the magnetic stray field, a differentiation between smaller metal bodies in the closer vicinity and larger metal bodies that are in a farther distance from the proximity switch may be possible. If, for constructional reasons, it is advisable that the chip or substrate of the inductive proximity switch is mounted on a metal lead frame, the magnetic field can still decay relatively quickly in the relatively thin lead frame, while the magnetic field in a larger metal object that is farther away may decay more slowly. Furthermore, a differentiation between objects comprising metals with ferromagnetic properties such as iron and non-magnetic metals may be possible, since the magnetic field decays even more slowly in a conductive ferromagnetic body or object.

According to another embodiment of the present invention a plurality of proximity switches is provided and may be arranged on a common chip or substrate. The plurality of proximity switches may, for instance, be arranged in a circle so as to provide an angle of rotation sensor in combination with a rod-shaped or star-shaped metal object. Alternatively, the plurality of proximity switches may be arranged in a matrix so as to recognize the shapes of metal parts positioned thereabove or two-dimensional movements.

The signals of the individual proximity switches may be quantitatively evaluated, and three-dimensional images of metal objects positioned above the proximity switch matrix may be obtained. For instance, it might thus be possible to examine coins in automated machines and money sorting machines not only pursuant to their size and weight, but also pursuant to their stamping.

According to another aspect of the present invention an inductive proximity switch is provided comprising at least one inductive element that is flown through by a pulse-shaped or sinusoidal current, and wherein the time characteristic of the voltage induced in the at least one inductive element may be evaluated after switching off the current pulse. The inductive element of the proximity switch may be implemented, for instance, as a coil or an antenna. This embodiment of an inductive proximity switch according to the present invention can function with one inductive element or coil only.

According to another aspect of the present invention an inductive proximity switch is provided comprising at least one planar transmitter coil and a coil arrangement of at least one planar receiver coil that is arranged in a layer parallel to the transmitter coil, wherein the coil arrangement is arranged vis-à-vis the transmitter coil such that, with an undisturbed stray field of the transmitter coil, almost no voltage is induced in the coil arrangement, and that, with a stray field that is distorted by a metal object positioned in the vicinity, a detectable voltage is induced in the coil arrangement.

According to still another aspect of the present invention an inductive proximity switch is provided comprising at least two similar inductive elements or coils, wherein the inductances of the inductive elements or coils are equal with an undisturbed magnetic stray field, and the inductive proximity switch further comprises an evaluation circuit for comparing the inductances of the two inductive elements or coils. As mentioned above another aspect of the present invention resides in an arrangement of a plurality of inductive proximity switches on a common chip or substrate, wherein the inductive element of the proximity switch may be implemented, for instance, as a coil or an antenna.

In the following detailed description, reference is made to the accompanying drawings, which form a part thereof, and in which is shown by way of illustration specific embodiments in which the invention may be practiced. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, is therefore not to be taken in a limiting sense, and the scope of the present invention is defined by the appended claims.

FIG. 1 shows a schematic top view of an inductive proximity switch S according to an embodiment of the present invention comprising two inductive elements or coils 2 and 3 integrated on a chip or substrate 1. In the vicinity of the chip 1 an adjacent metal body or object B is present. The arrangement of the coils 2, 3 is of importance for the embodiment of the invention shown in FIG. 1 which is based on an inductance comparison between the inductance of coils 2 and 3. In an embodiment, capacitors 20 and 22 are disposed on substrate 1 and are coupled to coils 2 and 3, respectively.

Figure 2:
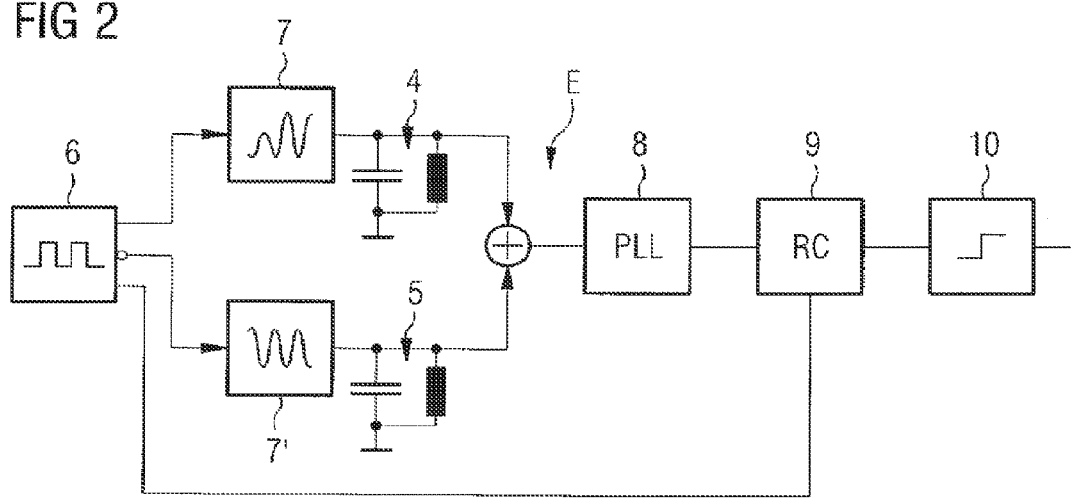
FIG. 2 shows a block diagram of an evaluation circuit for evaluating the signals from an inductive proximity switch according to the present invention.

FIG. 2 shows a block diagram of an evaluation circuit E for evaluating the signals from an inductive proximity switch according to the present invention. The evaluation circuit may comprise two LC oscillators 4 and 5 that can be alternately activated and deactivated. The activation and deactivation of the two LC oscillators 4, 5 may be controlled by a clock generator 6. Control circuits 7 and 7' may provide AC voltage signals to the LC oscillators 4, 5 in an alternate manner, respectively.

One of the LC oscillators 4, 5 and one of the control circuits 7 and 7' form an oscillator circuit, respectively. The sinusoidal signs within the control circuit blocks 7 and 7' indicate that the control circuit blocks 7 and 7' may provide the LC oscillators 4, 5 with sinusoidal signals, too. The LC oscillators 4, 5 shown in FIG. 2 may be considered equivalent to the inductive elements or coils 2 and 3 shown in FIG. 1. In an embodiment the LC oscillators 4, 5 shown in FIG. 2 may also be implemented by coils 2 and 3 and capacitors 20 and 22 shown in FIG. 1.

The evaluation circuit E may further comprise a phase locked loop (PLL) circuit 8 for frequency demodulation of a sum signal derived from an addition of the output signals of the LC oscillators 4, 5. By means of an active rectifier circuit (RC) 9 the demodulator output of the PLL 8 may be converted into a rectified signal. The active rectifier circuit 9 may be coupled to the clock generator 6 for synchronization of the rectifying signal processing with the clock signal in the active rectifier circuit 9. The rectified signal produced by the active rectifier circuit 9 may correspond to the frequency difference of the two LC oscillators 4, 5. The rectified signal may be subsequently forwarded to and evaluated by a threshold value detector 10.

Figure 3:
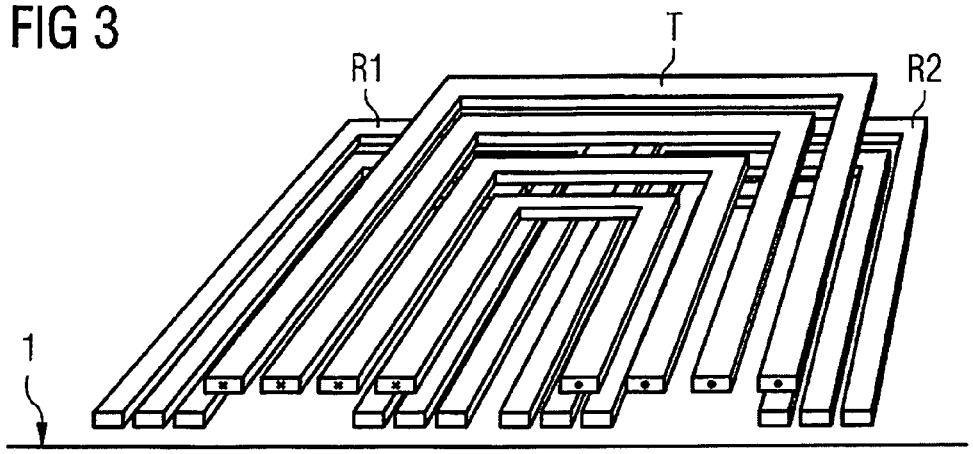
FIG. 3 shows a perspective view of a coil arrangement for an inductive proximity switch according to an embodiment of the present invention.

Further embodiments of the inductive proximity switch according to the present invention are illustrated in FIGS. 3, 4, 5a, 5b and 6. FIG. 3 shows a perspective view of a coil arrangement for an inductive proximity switch according to an embodiment of the present invention. The coil arrangement shown in FIG. 3 comprises a transmitter coil T and two receiver coils R1 and R2 that are positioned underneath the transmitter coil T so that that the transmitter coil T is positioned in one layer of the chip 1 and the receiver coils R1 and R2 are located in a different layer of the chip 1 parallel to the layer of the transmitter coil T. Both the transmitter coil T and the two receiver coils R1 and R2 may comprise a plurality of conductor paths or windings arranged on the chip 1 or substrate, respectively.

Furthermore, the two receiver coils R1 and R2 may be arranged underneath the transmitter coil T in a staggered manner relative to the transmitter coil T so that the position of the receiver coils R1 and R2 in their horizontal dimension are at least partly displaced from the vertical and/or horizontal position of the transmitter coil T. The direction of the current flowing through the transmitter coil T is indicated by crosses (current direction into the image plane) and dots (current direction out of the image plane) in the cross section surface of the conductor paths or windings of the transmitter coil T. The conductor paths or windings of the transmitter coil T may be provided with a larger cross section than the conductor paths or windings of the receiver coils R1 and R2. Thus, the conductor path resistance of the transmitter coil T and the electromagnetic near field can be reduced.

Figure 4:
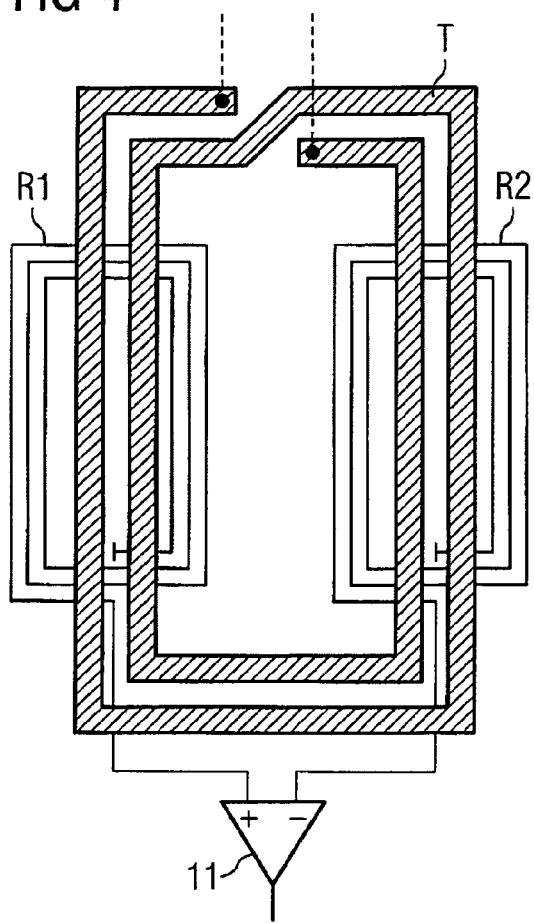
FIG. 4 shows a top view of a coil arrangement for an inductive proximity switch according to an embodiment of the present invention.

FIG. 4 shows a top view of a coil arrangement for an inductive proximity switch according to another embodiment of the present invention. The embodiment shown in FIG. 4 comprises a transmitter coil T and receiver coils R1 and R2 positioned below the transmitter coil T. Both the transmitter coil T and the receiver coils R1 and R2 comprise a plurality of conductor paths or windings, respectively. The conductor paths or windings of the transmitter coil T are indicated by a hatched area, and the conductor paths or windings of the receiver coils R1 and R2 are indicated by plain lines in FIG. 4.

A connection from the endings of the conductor paths or windings of the transmitter coil T to a voltage or current source (not shown) is indicated by dashed lines in FIG. 4. The endings of the conductor paths or windings of the receiver coils R1 and R2 may be coupled to a differential amplifier 11, respectively. Via the connection between the conductor paths or windings of the receiver coils R1 and R2 and by means of the differential amplifier 11 it is possible to evaluate a difference of the voltages induced into the receiver coils R1 and R2.

Figure 5A:
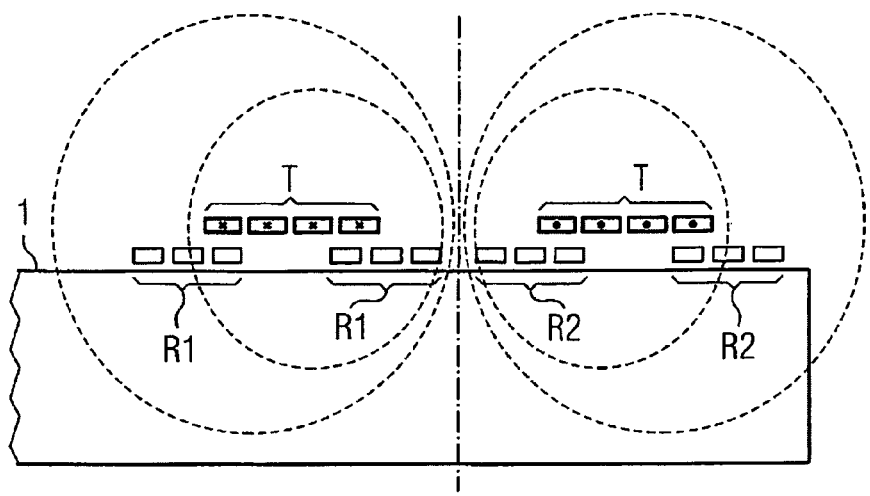
FIG. 5a shows a cross section of a coil arrangement for an inductive proximity switch according to an embodiment of the present invention.

FIG. 5a shows a cross section of the coil arrangement for an inductive proximity switch according to the embodiment of the present invention shown in FIG. 4. The rectangle shown in FIG. 5a indicates the cross section face of a chip or substrate 1 carrying the inductive elements or coils T, R1, R2 of the inductive proximity switch. As can be seen from FIG. 5a the coil arrangement comprises a transmitter coil T and two receiver coils R1 and R2, wherein the receiver coils R1, R2 are located in a layer below the transmitter coil T. Thus, the transmitter coil T is positioned in one layer of the chip or substrate 1 and the receiver coils R1, R2 are located in a different layer of the chip or substrate 1 parallel to the layer of the transmitter coil T.

The receiver coils R1, R2 are arranged such that a part of their cross-section is positioned within the horizontal extension of the transmitter coil T and another part of their cross-section is positioned outside the horizontal extension of the transmitter coil T. Thus, the voltage induced in the receiver coils R1, R2 with an undisturbed stray field and hence the common mode control range of a connected differential amplifier can be reduced.

The cross sections of the conductor paths or windings of the transmitter coils T and of the receiver coils R1, R2 can be provided in rectangular shape, respectively. However, any other shape for the cross sections of the conductor paths or windings of the transmitter coils T and of the receiver coils R1, R2 are possible. The direction of the current flowing through the transmitter coil T is again indicated in FIG. 5a by crosses (current direction into the image plane) and dots (current direction out of the image plane) in the cross section surface of the conductor paths or windings of the transmitter coil T.

The chain dotted line in the middle of FIG. 5a indicates a symmetry axis of the coil arrangement shown in FIG. 5a. The circular dashed lines indicate the distribution or the characteristic of the magnetic field generated by the transmitter coil T, if no metal body is present in the vicinity of the proximity switch. The arrow heads in the magnetic field lines indicate the direction of the magnetic flux of the magnetic field.

The transmitter coil T and the receiver coils R1, R2 may be arranged in a manner such that a major portion of the magnetic field lines pass above or below a receiver coil R1 or R2, and as few field lines as possible are encompassed by the conductor paths or windings of the receiver coils R1, R2. Thus, with an undisturbed magnetic field, i.e., without a metal body in the vicinity, only a low voltage is induced by the magnetic field generated by transmitter coil T into the receiver coils R1, R2. Due to the symmetry properties of the receiver coils R1, R2 the same voltage may be induced in both receiver coils R1, R2.

Figure 5B:
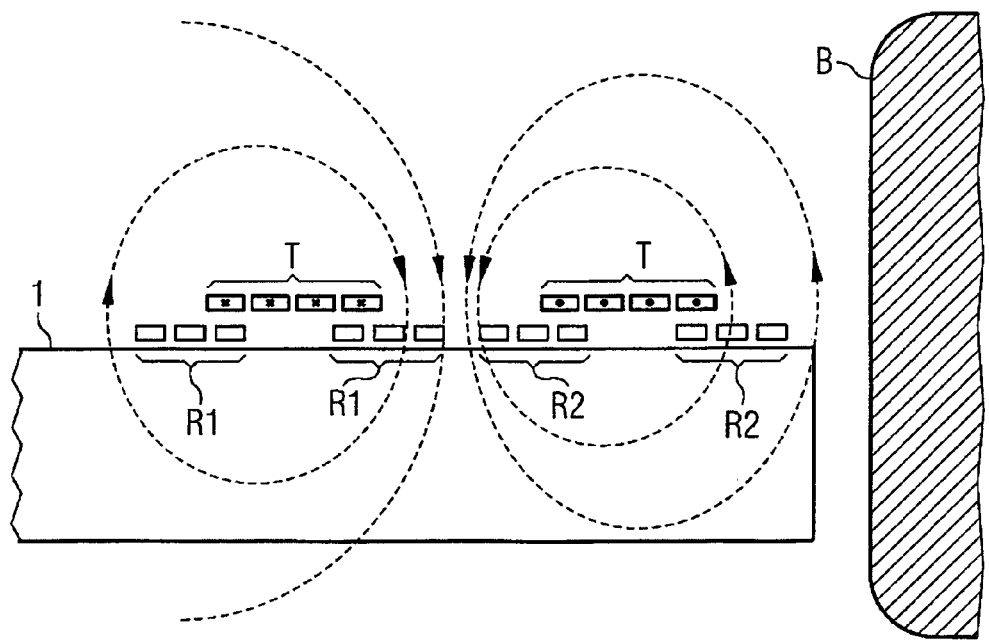
FIG. 5b shows a cross section of a coil arrangement for an inductive proximity switch according to an embodiment of the present invention.

FIG. 5b shows a cross section of the same coil arrangement for an inductive proximity switch according to the embodiment of the present invention as shown in FIG. 5a. Differential to FIG. 5a, in FIG. 5b a metal body B is present in the vicinity of the proximity switch. Hence, FIG. 5b shows the magnetic field line characteristic or the distribution of the magnetic field lines, if a metal body B is present in the vicinity.

An alternating current flowing through the conductor paths or windings of the transmitter coil T generate an alternating magnetic field as indicated by circular dashed lines. This alternating magnetic field may have such a high frequency that it does not significantly penetrate into the metal body B. Consequently, the magnetic field lines directed to the top may be condensed between the metal body B and the right side of the transmitter coil T causing a larger magnetic resistance in this area.

Due to the larger magnetic resistance at the right side of the transmitter coil T, the magnetic field lines exiting from the center of the transmitter coil T directed to the bottom may proceed less densely than on the left side of the transmitter coil T where the magnetic field is almost unchanged compared to the undisturbed situation shown in FIG. 5a without a metal body B is positioned in the vicinity. Thus in sum, more dense magnetic field lines directed to the top are passing the right receiver coil R2 than magnetic field lines directed to the bottom, whereby a voltage is induced in the right receiver coil R2.

In the left part of the coil arrangement, the circumstances are substantially unchanged compared to the undisturbed situation shown in FIG. 5a. Hence, in the situation shown in FIG. 5b, the voltage induced by the transmitter coil T in the left receiver coil R1 changes less than in the right receiver coil R2. The difference of the induced voltages can be tapped at the output of the differential amplifier 11 connected to both receiver coils R1, R2 as shown in FIG. 4. Furthermore, the output signal of the differential amplifier 11 may be evaluated by an evaluation circuit E as shown in FIG. 2. In this case the signal from the differential amplifier 11 may be supplied to the phase locked loop (PLL) circuit 8 and the active rectifier circuit 9 converting the demodulator output of the PLL 8 into a rectified signal and subsequently forwarded to the threshold value detector 10.

Figure 6:
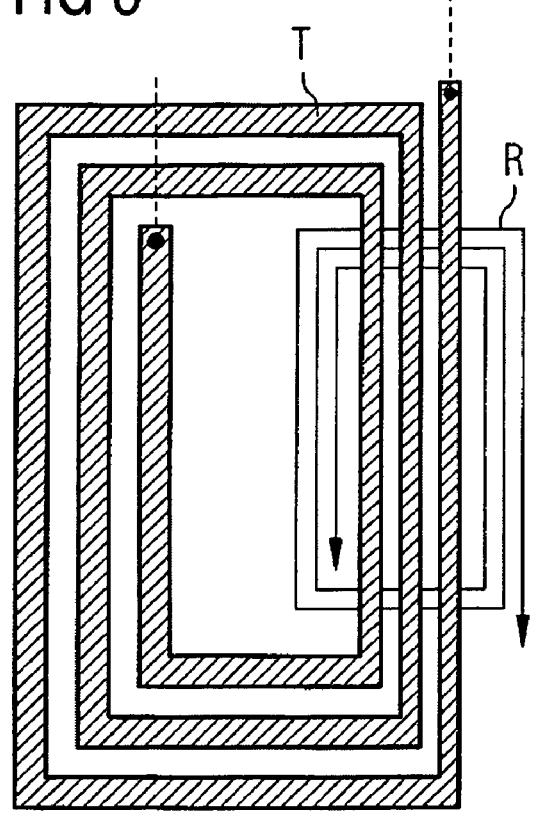
FIG. 6 shows a top view of a coil arrangement for an inductive proximity switch according to another embodiment of the present invention.

FIG. 6 shows a top view of a coil arrangement for an inductive proximity switch according to another embodiment of the present invention. The embodiment shown in FIG. 6 comprises one transmitter coil T and only one receiver coil R. This arrangement can be considered similar to the arrangement on the right side of FIG. 5a. The conductor paths or windings of the transmitter coil T are again indicated by a hatched area, and the conductor paths or windings of the receiver coil R are indicated by plain lines. Dashed lines from the endings of the conductor paths or windings of the transmitter coil T indicate a connection to a voltage or current source (not shown), and the endings of the conductor paths or windings of the receiver coil R may be coupled, for instance, to a single input amplifier or to a differential amplifier as shown in FIG. 4.

The transmitter coil T shown in FIG. 6 comprises asymmetric conductor paths or windings with a longitudinal layout causing an asymmetric magnetic field. The left parts or sections of the conductor paths or windings of the transmitter coil T may comprise a larger diameter than the right parts or sections of the conductor paths causing a stronger spreading of the conductor paths at the left side of the transmitter coil T.

Due to the stronger spreading of the conductor paths or windings at the left side of the transmitter coil T, the magnetic paths of the magnetic field lines are longer in this area. Thus, at least an electromagnetic near field of the transmitter coil T is developed stronger at the right side than at the left side of the transmitter coil T. Moreover, the longitudinal layout of the asymmetric conductor paths or windings causes a lower magnetic field strength at the front sides of the transmitter coil T.

The receiver coil R may be arranged such that it does not enclose any field lines in the situation with an undisturbed magnetic field, i.e., without a metal object or body in the vicinity. In case a metal body is positioned at the right next to the transmitter coil T, the cross section available to the magnetic field lines is be reduced in the respective area between the metal body and the transmitter coil T. The field lines may proceed closer along the transmitter coil T and are thus partially covered by the receiver coil R.

Figure 7:
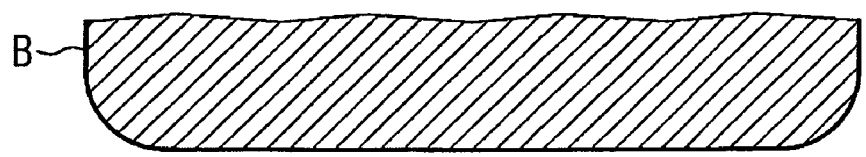
FIG. 7 shows a schematic view illustrating the functionality of an inductive proximity switch according to an embodiment of the present invention in a situation with a metal object in the vicinity.
Figure 7:
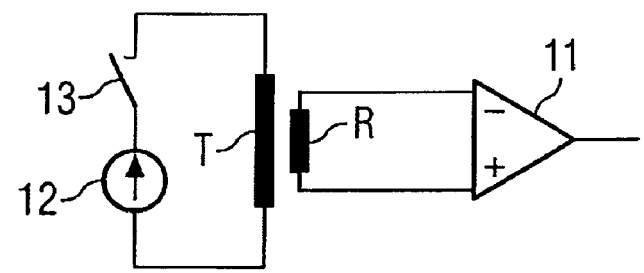

FIG. 7 shows a schematic view for illustration of the functionality of an inductive proximity switch according to an embodiment of the present invention in a situation with a metal object B in the vicinity. The inductive proximity switch may comprise a transmitter coil T and a receiver coil R. The receiver coil R may be coupled to a differential amplifier 11 and the transmitter coil T may be coupled to a current source 12 which may be switchable by the switch 13. The transmitter coil T may be applied, by means of a switchable current source 12, for instance, with a pulse-shaped current profile. Alternatively, the current flowing through a transmitter coil T may be sinusoidal.

Driven by switchable current source 12, the transmitter coil T generates an alternating magnetic stray field surrounding the receiver coil R, and a current is thus induced in the receiver coil R. In case a metal body B comes into the magnetic stray field, the magnetic flux of the stray field is influenced and the current induced in the receiver coil R changes. The presence of the metal body B in the vicinity of the coil arrangement can be detected by evaluation of the output voltage signal from the receiver coil R by means of the differential amplifier 11 measuring the changing of the current induced in the receiver coil R.

Figure 8A:
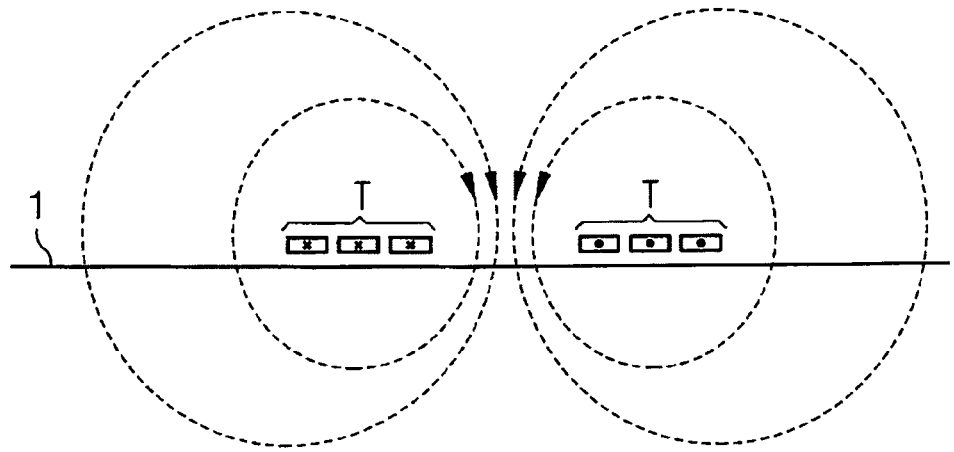
FIGS. 8a, 8b and 8c illustrate the condition of a magnetic stray field generated by an inductive proximity switch in different situations.
Figure 8B:
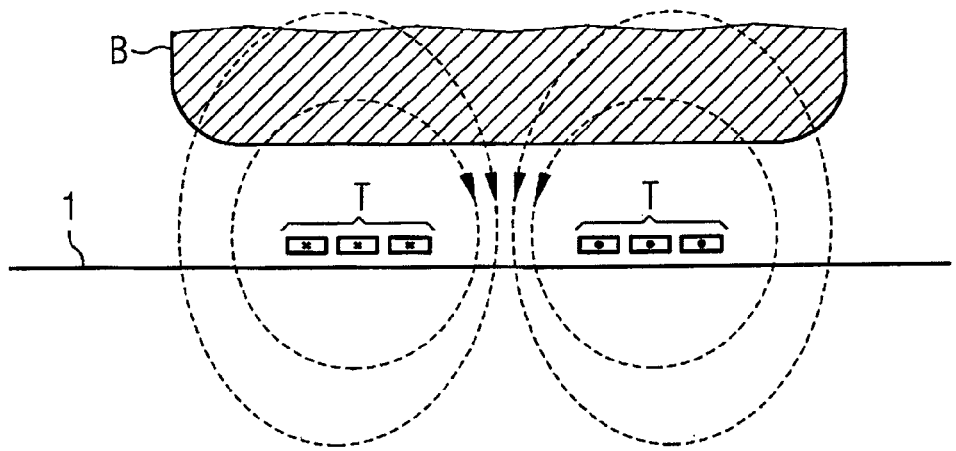
Figure 8C:
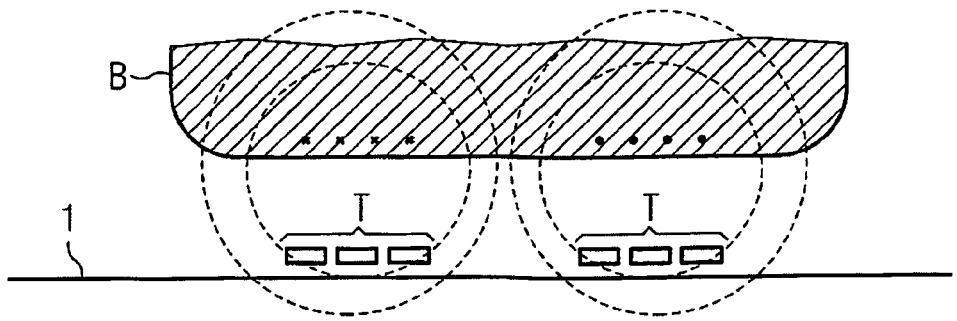

FIGS. 8a, 8b and 8c illustrate conditions of the magnetic stray field of a proximity switch in different situations depending on the presence of a metal body B in the vicinity and depending on the current flowing through a coil arrangement for an inductive proximity switch according to the present invention. As described a magnetic stray field is generated by the transmitter coil T of the inductive proximity switch. With a switched-on current source 12, a magnetic field is built around the transmitter coil T. In case no metal body is in the vicinity, the field lines of the magnetic stray field may be as illustrated in FIG. 8a.

The switchable current source 12 may be designed such that it is adapted to assume a high commutation voltage of the transmitter coil during switching off of the current. This may be of importance in case the transmitter coil T is without current after a short time period. During the commutation, a very high voltage pulse is generated at the transmitter coil T and at the receiver coil R, then the voltage, depending on the damping, collapses to Zero.

In a steady state of a metal body B in the vicinity of an inductive proximity switch, the field lines proceed in the presence of a non-magnetic metal body B (e.g., made of aluminum) in the way they proceed if the metal body is not available. If the metal body has ferromagnetic properties, the field lines proceed preferably perpendicular to the surface of the metal body and penetrate into it more deeply. Such a field line characteristic is illustrated in FIG. 8b.

If the current flowing through the transmitter coil T is switched off, a circular current flow in the metal body B delays the collapsing of the magnetic field. The surface of the metal body B may act like a shading coil of a transformer that is formed together with the transmitter coil T. The circular current flow on its part generates magnetic field lines, part of which the transmitter coil encloses. This behavior is illustrated in FIG. 8c.

FIGS. 9a, 9b, 9c and 9d illustrate current profiles of a transmitter coil and of the receiver coils in an inductive proximity switch in different situations depending on the presence of a metal body B in the vicinity of an inductive proximity switch according to the present invention and depending on the current flowing through a coil arrangement for an inductive proximity switch according to the present invention.

Figure 9A:
FIGS. 9a, 9b, 9c and 9d illustrate current profiles of a transmitter coil in an inductive proximity switch in different situations.
Figure 9B:
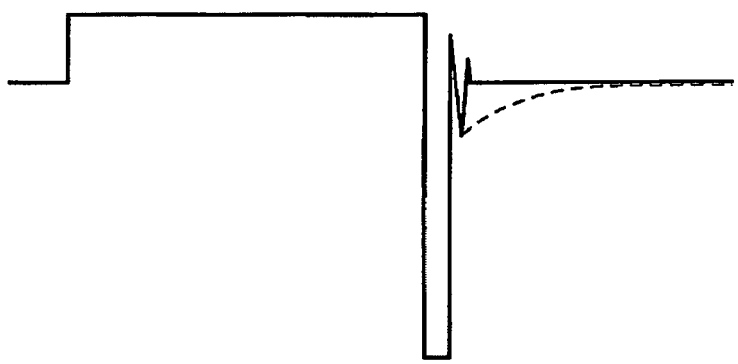
Figure 9C:
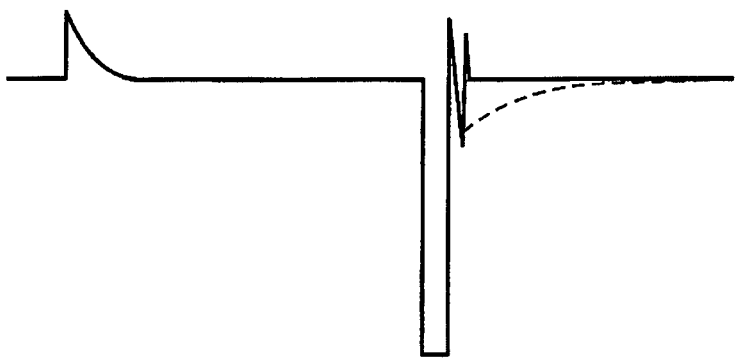
Figure 9D:
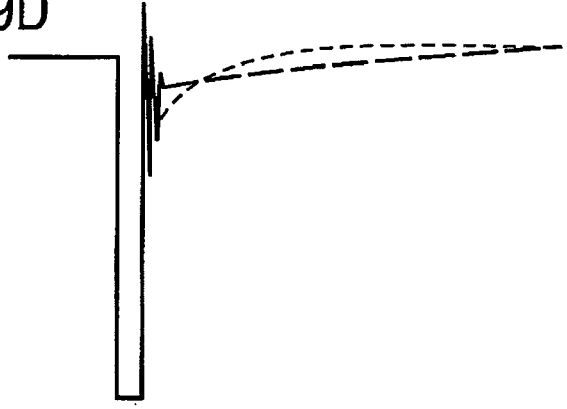

FIG. 9a illustrates the current profile in the transmitter coil, FIG. 9b shows the voltage characteristic at the transmitter coil, FIGS. 9c shows the voltage characteristic at a first receiver coil, and 9d shows the voltage characteristic at a second receiver coil. The continuous lines designate the voltage characteristic at the receiver coils without a metal body B present in the vicinity of the coil arrangement and the dashed lines designate the voltage characteristic at the receiver coils with a metal body B present in the vicinity of the coil arrangement, respectively.

Even some time after switching off the current through the transmitter coil T, the break-down of the magnetic field still continues. The change in the magnetic field induces a slowly decaying voltage in the transmitter coil T (and in a receiver coil R). The voltage in the transmitter coil T is directed against the voltage for building up the magnetic field and can be tapped. The resulting voltage characteristic is illustrated in FIG. 9b for the transmitter coil T and in FIG. 9c for the receiver coil R.

By means of the captured voltage characteristic, the size of the metal body B may also be detected. In the current profile shown in FIG. 9d, the voltage characteristic for a small or thin adjacent metal body B is illustrated in dots, and the voltage characteristic for a more remote larger metal object B is illustrated in dashes. Several of such characteristics that decay with different velocities may also be superimposed. By scanning the voltage characteristic at several points in time and by a corresponding evaluation, it is, for instance, possible to deduct the influence of a metallic lead frame to the proximity switch, e.g., in case the chip or substrate of the proximity switch has to be mounted on a lead frame for constructional reasons.

Figure 10:
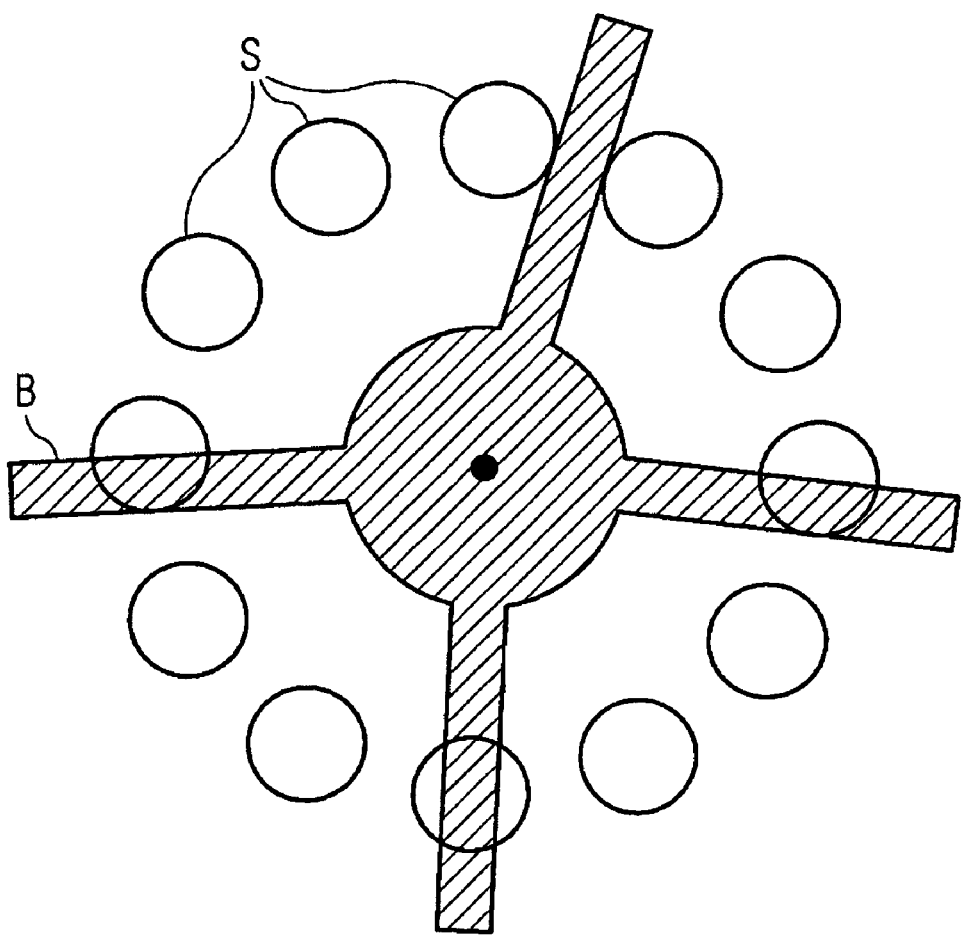
FIG. 10 schematically illustrates an arrangement of a plurality of proximity switches in accordance with an embodiment of the present invention.

FIG. 10 schematically illustrates an arrangement of a plurality of proximity switches in accordance with another embodiment of the present invention. In this embodiment a plurality of proximity switches S are arranged in a ring and illustrated by circles. Above the ring, for instance, an asymmetrically star-shaped metal body B may be positioned. Due to the asymmetry of the star-shaped metal body B it may be possible to unambiguously detect the orientation of the star-shaped metal body B by evaluation of the signals from the plurality of proximity switches S. As the distance of the beams that does not correspond to a multiple of the proximity switch distance this arrangement may enable a higher angle resolution. Furthermore, such an arrangement may be suitable for an angle of rotation sensor.

The individual proximity switches S may be of any of the above described type, and the current pulses of the current supply to the transmitter coil T of the proximity switches S may be switched on and off simultaneously, or crosswise alternately. A sequential operation should be avoided for reasons of a possible crosstalking of adjacent proximity switches S. If proximity switches S comprising more than one receiver coils R are used, a plurality of transmitter coils T may be arranged in a ring and may be controlled in-phase or alternately out of phase. The receiver coils R may be positioned in between the transmitter coils T and may induce a voltage only if the symmetry properties of the field line characteristic are distributed by a beam of the metal star which is positioned locally thereabove.

Proximity switches with only one receiver coil R are also suited for the arrangement with a plurality of proximity switches, if the inductance of the individual coils is respectively compared with the inductance of the adjacent coils or with an average value of the entirety of all coils. For instance, each coil might be connected with a capacitor and with active devices to form an LC oscillator, and the LC oscillators might be activated individually sequentially. The frequency-demodulated sum signal of all oscillator vibrations results in an image of the star-shaped metal body B, and the phasing of this image corresponds to the rotation angle.

While specific configurations and arrangements are discussed, it should be understood that this is done for illustrative purposes only. A person skilled in the pertinent art will recognize that other configurations and arrangements can be used without departing from the spirit and scope of the present invention. It will be apparent to a person skilled in the relevant art that this invention can also be employed in a variety of other applications.

While various embodiments of the present invention have been described above, it should be understood that they have been presented by way of example only, and not as limitations. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An inductive proximity switch device comprising:
a plurality of inductive elements disposed on a common substrate, the inductive elements arranged in one or more metalizing layers on the common substrate, the inductive elements comprising
a transmitter coil, and
a plurality of receiver coils; and
an evaluation circuit coupled to at least one of the plurality of the inductive elements, wherein the transmitter coil is configured to generate a magnetic stray field that reaches a metal object present in the vicinity of the proximity switch device, and the receiver coils are arranged and configured such that, with an undisturbed magnetic stray field, voltages induced by the magnetic stray field in the receiver coils are substantially equal; and
a plurality of capacitors integrated on the common substrate, wherein the receiver coils are coupled with the capacitors to form LC oscillator circuits, each comprising an inductive element and a capacitive element.

2. The inductive proximity switch device according to claim 1, wherein the common substrate comprises a single chip such that the inductive elements are monolithically integrated on the single chip.

3. The inductive proximity switch device according to claim 1, wherein the inductive elements of the proximity switch are implemented as coils with a plurality of conductor paths or windings or antennas.

4. The inductive proximity switch device according to claim 1, wherein the evaluation circuit and the inductive elements are integrated on the common substrate.

5. The inductive proximity switch device according to claim 1, wherein two of the receiver coils are arranged and configured such that, if a metal body is present in the magnetic stray field, a magnetic field flowing through one of the two receiver coils changes more strongly than a magnetic field flowing through an other one of the two receiver coils.

6. The inductive proximity switch device according to claim 1, wherein the evaluation circuit is configured to evaluate output signals of the inductive elements that is integrated on the common substrate, and is configured to detect an approximation of a metal object in the vicinity of the proximity switch device from a difference between induced voltage or current characteristics of the receiver coils.

7. The inductive proximity switch device according to claim 1, wherein the evaluation circuit is configured to evaluate output signals of the inductive elements that is integrated on the common substrate, wherein the evaluation circuit comprises a differential amplifier for detecting the difference between induced voltage or current characteristics of the receiver coils.

8. The inductive proximity switch device according to claim 7, wherein conductor paths or windings of the receiver coils are coupled to the differential amplifier, respectively, the differential amplifier being configured to recognize a difference of the voltages induced into the receiver coils.

9. The inductive proximity switch device according to claim 1, wherein the receiver coils are complementary connected in series with each other, so that their induced voltages substantially compensate each other in an undisturbed magnetic stray field with no metal object positioned in the vicinity of the proximity switch device, and do not compensate each other in case of an disturbed stray field due to a metal object or body positioned in the vicinity of the proximity switch.

10. The inductive proximity switch device according to claim 1, wherein the LC oscillators circuits are configured to be alternately switched on and off, and an evaluation circuit is configured to evaluate a frequency modulation of a sum signal derived from an addition of output signals of the LC oscillator circuits.

11. The inductive proximity switch device according to claim 1, wherein the receiver coils are arranged in a layer parallel to a layer of the transmitter coil such that the transmitter coil and the receiver coils are arranged in a planar manner integrated on the common substrate.

12. The inductive proximity switch device according to claim 11, wherein part of a cross-section of the receiver coils is positioned inside dimensions of the transmitter coil and another part of the cross-section of the receiver coils is positioned outside dimensions of the transmitter coil.

13. The inductive proximity switch device according to claim 12, wherein the receiver coils are arranged in a staggered manner with respect to the transmitter coil such that, with an undisturbed stray field, magnetic flux passing through the receiver coil outside and inside the transmitter coil is substantially compensated.

14. An inductive proximity switch device comprising:
a plurality of inductive elements disposed on a common substrate, the inductive elements arranged in one or more metalizing layers on the common substrate, the inductive elements comprising
at least one transmitter coil, and
at least one receiver coil; and
an evaluation circuit coupled to at least one of the plurality of the inductive elements, wherein the transmitter coil comprises asymmetric conductor paths or windings with a longitudinal layout causing an asymmetric magnetic field.

15. The inductive proximity switch device according to claim 14, wherein at least one inductive element is coupled to a switchable current source configured to provide alternating current pulses to the inductive element to generate a magnetic stray field surrounding the inductive element, such that a current is induced in the inductive element during a subsequent relaxation of the magnetic stray field, when the switchable current source is switched off.

16. The inductive proximity switch device according to claim 15, wherein the switchable current source is configured to generate, using the transmitter coil, an alternating magnetic field with a frequency that does not significantly penetrate into a metal body present in the magnetic field.

17. The inductive proximity switch device according to claim 14, comprising at least one inductive element flown through by a pulse-shaped or a sinusoidal current, wherein the evaluation circuit is configured to evaluate a time characteristic of a voltage induced in the at least one inductive element after switching off the pulse-shaped or sinusoidal current.

18. The inductive proximity switch device according to claim 14, wherein sections of the conductor paths or windings of the transmitter coil comprise a larger diameter than other sections of the conductor paths or windings of the transmitter coil.

19. An inductive proximity switch device comprising:
a plurality of inductive elements disposed on a common substrate, the inductive elements arranged in one or more metalizing layers on the common substrate, the inductive elements comprising
at least one transmitter coil, and
at least one receiver coil; and
an evaluation circuit coupled to at least one of the plurality of the inductive elements, wherein the transmitter coil comprises conductor paths or windings having a first pitch in a first portion of the transmitter coil and a second pitch in a second portion of the transmitter coil, such that the transmitter coil generates an asymmetric magnetic stray field, wherein the first pitch is different from the second pitch, and the second portion is opposite the first portion.

20. The inductive proximity switch device according to claim 1, wherein the transmitter coil is connected to a switchable current source configured to switch current flowing through the transmitter coil on and off in a pulse-shaped or in a sinusoidal manner.

21. The inductive proximity switch device according to claim 1, wherein conductor paths or windings of the at least one transmitter coil comprises a larger cross section than conductor paths or windings of the at least one receiver coil.

22. An inductive proximity switch device comprising:
a plurality of inductive elements disposed on a common substrate, the inductive elements arranged in one or more metalizing layers on the common substrate, the inductive elements comprising
at least one transmitter coil, and
at least one receiver coil; and
an evaluation circuit coupled to at least one of the plurality of the inductive elements, wherein the evaluation circuit comprises a phase locked loop circuit for evaluation of frequency modulation.

23. The inductive proximity switch device according to claim 22, wherein the transmitter coil and the receiver coil are arranged in a manner such that a magnetic stray field generated by the at least one transmitter coil surrounds the at least one receiver coil inducing a voltage or current in the at least one receiver coil.

24. The inductive proximity switch device according to claim 23, wherein conductor paths or windings of the transmitter coil comprise a larger cross section than conductor paths or windings of the receiver coils.

25. The inductive proximity switch device according to claim 23, wherein the evaluation circuit is configured to evaluate output signals of the inductive elements that is integrated on the common substrate, and is configured to evaluate the induced voltage or current characteristics of the receiver coils for detecting objects comprising metals present in the magnetic stray field generated by the transmitter coil of the proximity switch device.

26. The inductive proximity switch device according to claim 23, wherein the evaluation circuit is configured to evaluate output signals of the inductive elements that is integrated on the common substrate, and is configured to evaluate the induced voltage or current characteristics of the receiver coils for differentiation between objects comprising different ferromagnetic metals or non-magnetic metals present in the magnetic stray field generated by the transmitter coil.

27. The inductive proximity switch device according to claim 23, wherein the evaluation circuit is configured to evaluate output signals of the inductive elements that is integrated on the common substrate, and is configured to evaluate the induced voltage or current characteristics of the receiver coils for differentiation between a presence of smaller metal bodies in a closer vicinity of the proximity switch device and larger metal bodies in a farther distance from the proximity switch device.

28. The inductive proximity switch device according to claim 22, wherein the transmitter coil and the receiver coil are configured such that they comprise the same inductance.

29. The inductive proximity switch device according to claim 22, further comprising a plurality of capacitor integrated on the common substrate, wherein the receiver coils are coupled with the capacitors to form LC oscillator circuits, each comprising an inductive element and an capacitive element, wherein the phase locked loop circuit is configured to perform frequency demodulation of a sum signal derived from an addition of output signals of the LC oscillator circuits.

30. The inductive proximity switch device according to claim 22, wherein the evaluation circuit further comprises an active rectifier circuit configured to convert a demodulator output of the phase locked loop circuit into a rectified signal.

31. The inductive proximity switch device according to claim 30, wherein the active rectifier circuit is coupled to a clock generator for synchronization of the rectified signal with a clock signal.

32. The inductive proximity switch device according to claim 30, wherein the evaluation circuit further comprises a threshold value detector configured to evaluate the rectified signal.

* * * * *